(12) United States Patent
Lin et al.

(10) Patent No.: US 10,199,345 B2
(45) Date of Patent: Feb. 5, 2019

(54) METHOD OF FABRICATING SUBSTRATE STRUCTURE

(71) Applicant: Siliconware Precision Industries Co., Ltd., Taichung (TW)

(72) Inventors: Hsin-Ta Lin, Taichung (TW); Ching-Wen Chiang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/867,008

(22) Filed: Jan. 10, 2018

(65) Prior Publication Data

US 2018/0138140 A1 May 17, 2018

Related U.S. Application Data

(62) Division of application No. 14/981,549, filed on Dec. 28, 2015, now Pat. No. 9,899,344.

(30) Foreign Application Priority Data

Jun. 2, 2015 (TW) .............................. 104117740 A

(51) Int. Cl.
*H01L 21/4763* (2006.01)
*H01L 23/00* (2006.01)
*H01L 23/498* (2006.01)
*H01L 21/48* (2006.01)
*H01L 23/31* (2006.01)

(52) U.S. Cl.
CPC .......... *H01L 24/13* (2013.01); *H01L 21/4846* (2013.01); *H01L 23/49816* (2013.01); *H01L 23/49894* (2013.01); *H01L 24/11* (2013.01); *H01L 23/3192* (2013.01); *H01L 2224/1145* (2013.01); *H01L 2224/11462* (2013.01); *H01L 2224/11464* (2013.01); *H01L 2224/13016* (2013.01); *H01L 2224/13025* (2013.01); (Continued)

(58) Field of Classification Search
CPC ....... H01L 2224/73204; H01L 2224/81; H01L 24/13; H01L 24/16; H01L 2224/05551
USPC .......................... 438/106, 108, 613, 615, 618
See application file for complete search history.

(56) References Cited

U.S. PATENT DOCUMENTS 7,327,031 B2   2/2008  Takewaki et al.
7,985,671 B2 *  7/2011  Daubenspeck ......... H01L 24/11
                                                 257/737

(Continued)

*Primary Examiner* — S. V. Clark
(74) *Attorney, Agent, or Firm* — Mintz Levin Cohn Ferris Glovsky and Popeo, P.C.; Peter F. Corless; Steven M. Jensen

(57) ABSTRACT

A substrate structure is provided, which includes: a substrate body having a plurality of conductive pads; an insulating layer formed on the substrate body and exposing the conductive pads; a plurality of conductive vias formed in the insulating layer and electrically connected to the conductive pads; a plurality of circuits formed on the conductive vias and in the insulating layer, wherein the circuits are greater in width than the conductive vias; and a plurality of conductive posts formed on the circuits and the insulating layer, wherein each of the conductive posts has a width greater than or equal to that of each of the circuits. The conductive vias, the circuits and the conductive posts are integrally formed. As such, micro-chips or fine-pitch conductive pads can be electrically connected to the substrate structure in a flip-chip manner.

5 Claims, 4 Drawing Sheets

(52) U.S. Cl.
CPC ........... *H01L 2224/13144* (2013.01); *H01L 2224/13147* (2013.01); *H01L 2924/2064* (2013.01)

(56) References Cited

U.S. PATENT DOCUMENTS

| | | | |
|---|---|---|---|
| 9,209,150 B2* | 12/2015 | Lee | H01L 24/24 |
| 2012/0280407 A1 | 11/2012 | Do et al. | |
| 2012/0306104 A1 | 12/2012 | Choi et al. | |
| 2013/0026609 A1* | 1/2013 | Wu | H01L 23/13 |
| | | | 257/632 |
| 2014/0312512 A1* | 10/2014 | Choi | H01L 21/4846 |
| | | | 257/779 |
| 2016/0276256 A1 | 9/2016 | Chiang et al. | |

* cited by examiner

METHOD OF FABRICATING SUBSTRATE STRUCTURE

CROSS-REFERENCE TO RELATED APPLICATION(S)

This application is a divisional of copending application U.S. Ser. No. 14/981,549, filed on Dec. 28, 2015, which claims under 35 U.S.C. § 119(a) the benefit of Taiwanese Application No. 104117740, filed Jun. 2, 2015, the entire contents of which are incorporated herein by reference.

BACKGROUND OF THE INVENTION

1. Field of the Invention

The present invention relates to substrate structures, and more particularly, to a substrate structure having conductive bumps.

2. Description of Related Art

Conventional flip-chip semiconductor packaging technologies mainly involve forming solder bumps on conductive pads of chips and electrically connecting the solder bumps to packaging substrates. Compared with wire bonding technologies, flip-chip technologies lead to shorter conductive paths and improved electrical performance. Further, back surfaces of chips can be exposed to improve the heat dissipating efficiency.

FIG. 1 is a schematic partial cross-sectional view of a conventional substrate structure. Referring to FIG. 1, a plurality of openings are formed in an insulating layer 11 of a chip 10 for exposing conductive pads 100 of the chip 10. Therein, the insulating layer 11 includes a first insulating layer 11a and a second insulating layer 11b. An adhesive layer 12, a wetting layer 13 and a protection layer 14 are sequentially formed in the openings of the insulating layer 11 and on the insulating layer 11, and a plurality of solder bumps 16 are formed on the protection layer 14 at positions corresponding to the conductive pads 100. Then, portions of the adhesive layer 12, the wetting layer 13 and the protection layer 14 that are not covered by the solder bumps 16 are removed. As such, the remaining portions of the adhesive layer 12, the wetting layer 13 and the protection layer 14 under each of the solder bumps 16 are defined as a UBM (Under Bump Metallurgy) layer 15 for firmly securing the solder bump 16 on the corresponding conductive pad 100.

The adhesive layer 12 is made of Ti, Cr or TiW so as to provide a strong bonding between the conductive pad 100 and the wetting layer 13. The wetting layer 13 is made of Ni or Cu, which is easily wettable by a solder material. Therefore, during a reflow process, the solder bump 16 can be completely bonded to the conductive pad 100 and assume a ball shape. The protection layer 14 is made of low resistance metal, for example, Au or Cu, so as to protect the solder bump 16 and reduce the resistance value thereof.

However, along with miniaturization of the chip 10, the pitch between the conductive pads 100 has been reduced. Accordingly, the conventional flip-chip packaging processes easily cause solder bridging to occur between adjacent solder bumps 16.

Therefore, how to overcome the above-described drawbacks has become critical.

SUMMARY OF THE INVENTION

In view of the above-described drawbacks, the present invention provides a substrate structure, which comprises: a substrate body having a plurality of conductive pads; an insulating layer formed on the substrate body and exposing the conductive pads; a plurality of conductive vias formed in the insulating layer and electrically connected to the conductive pads; a plurality of circuits formed on the conductive vias and in the insulating layer, wherein the circuits are greater in width than the conductive vias; and a plurality of conductive posts formed on the circuits and the insulating layer, wherein each of the conductive posts has a width greater than or equal to that of each of the circuits, and the conductive vias, the circuits and the conductive posts are integrally formed.

The present invention further provides a method for fabricating a substrate structure, which comprises the steps of: providing a substrate body having a plurality of conductive pads; forming an insulating layer on the substrate body; forming in the insulating layer a plurality of through holes exposing the conductive pads; forming in the insulating layer a plurality of grooves communicating with the through holes; and forming a conductive material in the through holes and the grooves and on the insulating layer, thereby forming in the through holes of the insulating layer a plurality of conductive vias electrically connected to the conductive pads, forming in the grooves of the insulating layer a plurality of circuits electrically connected to the conductive vias, and forming on the insulating layer a plurality of conductive posts electrically connected to the circuits, wherein the conductive vias, the circuits and the conductive posts are integrally formed.

In the above-described method, the conductive material can be formed by electroplating, chemical plating (electroless plating), sputtering or evaporation.

In the above-described structure and method, the substrate body can be made of silicon, ceramic or an organic material.

The present invention further provides a conductive structure bonded to an insulating layer. The conductive structure comprises: a plurality of conductive vias formed in the insulating layer; a plurality of circuits formed on the conductive vias and in the insulating layer, wherein the circuits are greater in width than the conductive vias; and a plurality of conductive posts formed on the circuits and the insulating layer, wherein each of the conductive posts has a width greater than or equal to that of each of the circuits, and the conductive vias, the circuits and the conductive posts are integrally formed.

In the above-described substrate structure, the fabrication method thereof and the conductive structure, the conductive vias, the circuits and the conductive posts (i.e., the conductive material) can be made of Cu or Au.

In the above-described substrate structure, the fabrication method thereof and the conductive structure, the width of the conductive posts can be less than 20 μm.

In the above-described substrate structure, the fabrication method thereof and the conductive structure, a plurality of conductive elements can be formed on the conductive posts.

According to the present invention, the conductive material is formed in the through holes and the grooves and on the insulating layer in a single process so as to integrally form the conductive vias, the circuits and the conductive posts, thereby allowing micro-chips or fine-pitch conductive pads to be electrically connected to the substrate structure in a flip-chip manner.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2H are schematic cross-sectional views showing a method for fabricating a substrate structure 2 according to the present invention.

Figure 1:
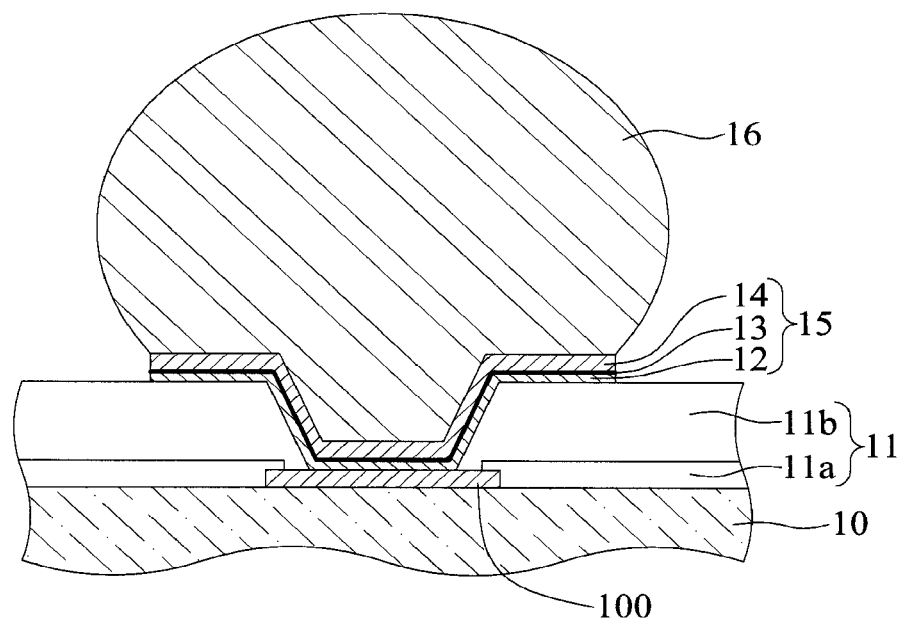
FIG. 1 is a schematic cross-sectional view of a conventional substrate structure having solder bumps.
Figure 2A:
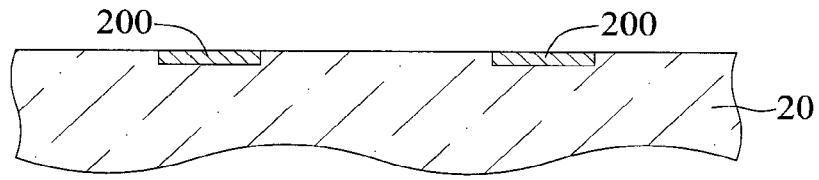
FIGS. 2A to 2H are schematic cross-sectional views showing a method for fabricating a substrate structure according to the present invention.

Referring to FIG. 2A, a substrate body 20 having a plurality of conductive pads 200 is provided. In the present embodiment, the substrate body 20 is made of silicon. In other embodiments, the substrate body 20 can be made of ceramic or an organic material.

Figure 2B:
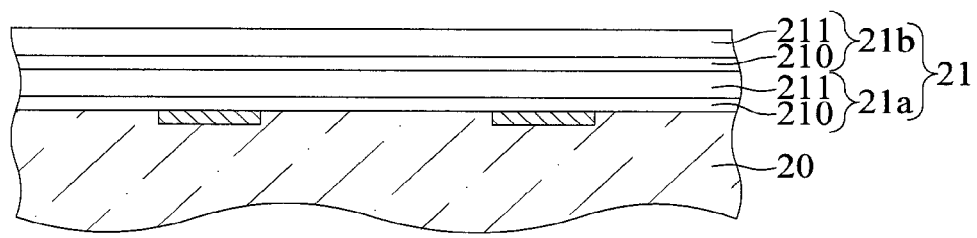

Referring to FIG. 2B, an insulating layer 21 is formed on the substrate body 20. The insulating layer 21 has a first sub-layer 21a in contact with the substrate body 20 and a second sub-layer 21b formed on the first sub-layer 21a.

In the present embodiment, each of the first sub-layer 21a and the second sub-layer 21b consists of a silicon nitride layer 210 and an oxide layer 211.

Figure 2C:
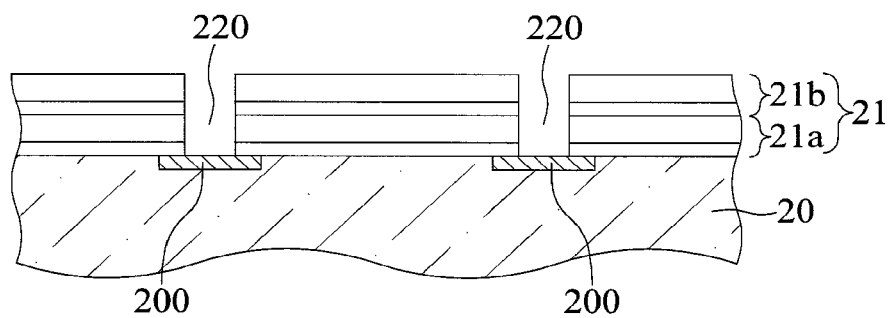

Referring to FIG. 2C, a plurality of through holes 220 are formed to penetrate the first sub-layer 21a and the second sub-layer 21b of the insulating layer 21, thereby exposing the conductive pads 200. In the present embodiment, the through holes 220 are formed by etching.

Figure 2D:
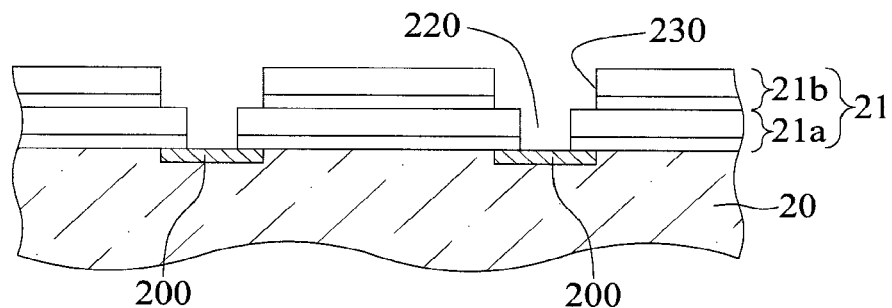

Referring to FIG. 2D, a plurality of grooves 230 are formed in the second sub-layer 21b of the insulating layer 21, communicating with the through holes 220. In the present embodiment, the grooves 230 are formed by etching.

Figure 2E:
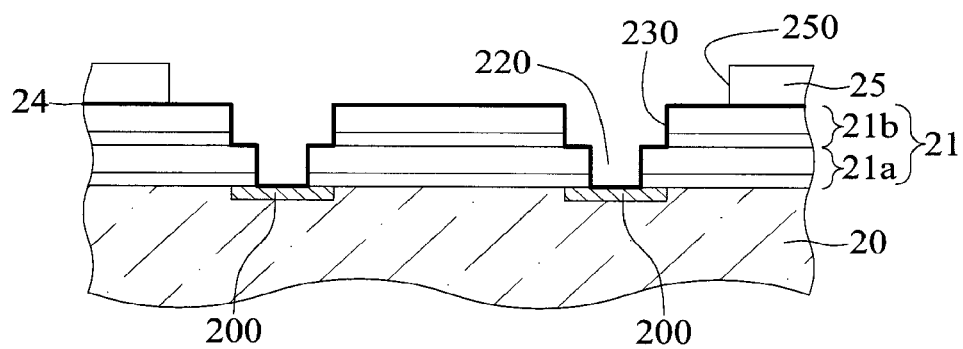

Referring to FIG. 2E, a barrier layer 24 is formed on the second sub-layer 21b, on walls of the grooves 230 and the through holes 220, and on the conductive pads 200. Then, a resist layer 25 is formed on the barrier layer 24 and a plurality of openings 250 are formed in the resist layer 25. In the present embodiment, each of the openings 250 exposes a plurality of through holes 220 and portions of the insulating layer 21 around the through holes 220.

In the present embodiment, the barrier layer 24 is made of TaN or TiN. The resist layer 25 is a dry film.

Figure 2F:
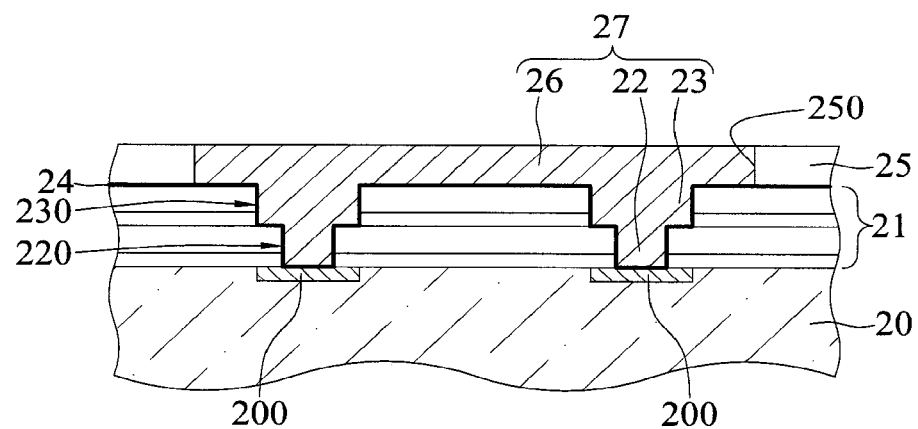

Referring to FIG. 2F, a conductive material 27 is formed in the through holes 220 and the grooves 230 of the insulating layer 21 and in the openings 250 of the resist layer 25. As such, a plurality of conductive vias 22 are formed in the through holes 220 and electrically connected to the conductive pads 200, a plurality of circuits 23 are formed in the grooves 230 and electrically connected to the conductive vias 22, and a plurality of conductive posts 26 are formed in the openings 250 of the resist layer 25, protruding from the grooves 230 and electrically connected to the circuits 23. The conductive vias 22, the circuits 23 and the conductive posts 26 are integrally formed. Therein, a single conductive post 26 covers a plurality of conductive vias 22.

In the present embodiment, the conductive material 27 is made of Cu or Au and formed by electroplating, chemical plating (electroless plating), sputtering or evaporation.

Figure 2G:
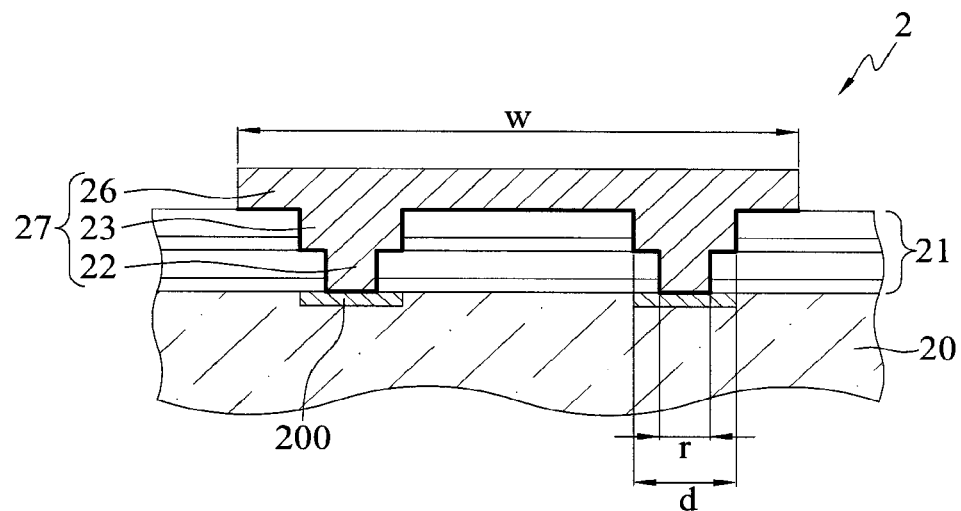

Referring to FIG. 2G, the resist layer 25 and the barrier layer 24 under the resist layer 25 are removed. In the present embodiment, the width w of the conductive posts 26 is less than 20 µm.

Figure 2H:
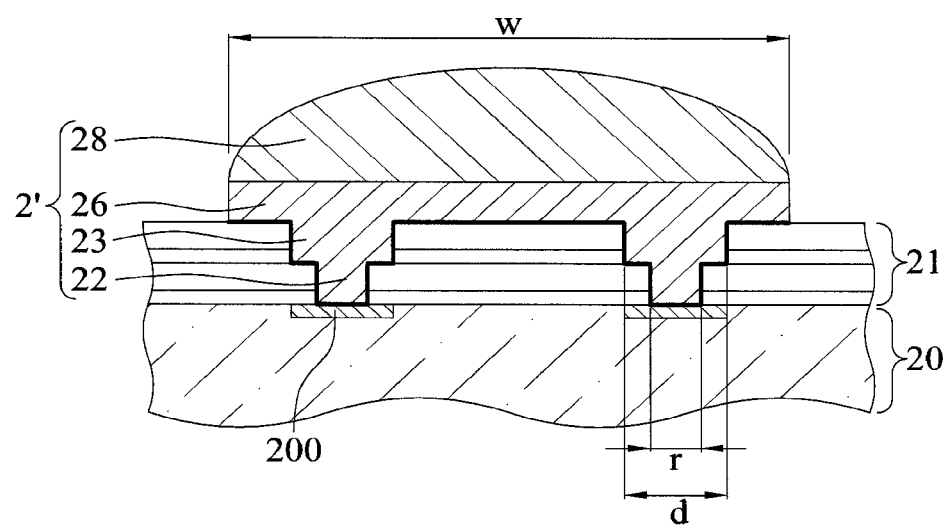

Referring to FIG. 2H, a plurality of conductive elements 28 are formed on the conductive posts 26. In the present embodiment, the conductive elements 28 include a solder material.

The present invention further provides a substrate structure 2, which has: a substrate body 20 having a plurality of conductive pads 200; an insulating layer 21 formed on the substrate body 20 and exposing the conductive pads 200; and a conductive structure 2' bonded to the insulating layer 21.

The conductive structure 2' has a plurality of conductive vias 22 formed in the insulating layer 21 and electrically connected to the conductive pads 200; a plurality of circuits 23 formed on the conductive vias 22 and in the insulating layer 21 and electrically connected to the conductive vias 22, wherein the width d of the circuits 23 are greater than the width r of the conductive vias 22; and a plurality of conductive posts 26 formed on the circuits 23 and the insulating layer 21 and each covering at least one of the conductive vias 22, wherein the width w of each of the conductive posts 26 is greater than or equal to the width d of each of the circuits 23. The conductive vias 22, the circuits 23 and the conductive posts 26 are integrally formed.

The substrate body 20 can be made of silicon, ceramic or an organic material.

In an embodiment, the conductive vias 22, the circuits 23 and the conductive posts 26 are made of Cu or Au.

In an embodiment, the width w of the conductive posts 26 is less than 20 µm.

In an embodiment, the substrate structure 2 (or the conductive structure 2') further has a plurality of conductive elements 28 formed on the conductive posts 26.

According to the present invention, the conductive material 27 is formed in the through holes 220 and the grooves 230 and on the insulating layer 21 in a single process. As such, the conductive vias 22, the circuits 23 and the conductive posts 26 are integrally formed and the width w of the conductive posts 26 is less than 20 µm, thereby allowing micro-chips or fine-pitch conductive pads to be electrically connected to the substrate structure in a flip-chip manner.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a substrate structure, comprising the steps of:
    providing a substrate body having a plurality of conductive pads;
    forming an insulating layer on the substrate body;
    forming in the insulating layer a plurality of through holes exposing the conductive pads;
    forming in the insulating layer a plurality of grooves communicating with the through holes; and
    forming a conductive material in the through holes and the grooves and on the insulating layer, thereby forming in the through holes of the insulating layer a plurality of conductive vias electrically connected to the conductive pads, forming in the grooves of the insulating layer a plurality of circuits electrically connected to the conductive vias, and forming on the insulating layer a plurality of conductive posts electrically connected to the circuits, wherein the conductive vias, the circuits and the conductive posts are integrally formed, and wherein the conductive posts have a width less than 20 μm.

2. The method of claim 1, wherein the substrate body is made of silicon, ceramic or an organic material.

3. The method of claim 1, wherein the conductive material is made of Cu or Au.

4. The method of claim 1, wherein the conductive material is formed by electroplating, chemical plating (electroless plating), sputtering or evaporation.

5. The method of claim 1, further comprising forming a plurality of conductive elements on the conductive posts.

\* \* \* \* \*